United States Patent [19]
Pletcher et al.

[11] Patent Number: 6,028,615
[45] Date of Patent: Feb. 22, 2000

[54] PLASMA DISCHARGE EMITTER DEVICE AND ARRAY

[75] Inventors: Timothy Allen Pletcher, Eastampton; Vipulkumar Kantilal Patel, Southbrunswick; Robert Amantea, Manalapan, all of N.J.

[73] Assignee: Sarnoff Corporation, Princeton, N.J.

[21] Appl. No.: 08/912,658

[22] Filed: Aug. 18, 1997

Related U.S. Application Data

[60] Provisional application No. 60/046,662, May 16, 1997.

[51] Int. Cl.[7] ............................................. B41J 2/415
[52] U.S. Cl. ................................................. 347/127
[58] Field of Search ................................. 347/127, 128, 347/141, 126; 315/111.81, 169.1, 169.3, 205; 438/20, 978; 29/25.02; 250/324

[56] References Cited

U.S. PATENT DOCUMENTS

| | | | |
|---|---|---|---|
| 4,155,093 | 5/1979 | Fotland et al. | 347/127 |
| 4,408,214 | 10/1983 | Fotland et al. | 347/128 |
| 4,409,604 | 10/1983 | Fotland | 347/127 |
| 4,426,654 | 1/1984 | Tarumi et al. | 347/127 |
| 4,498,952 | 2/1985 | Christensen | 438/20 |
| 4,675,703 | 6/1987 | Fotland | 347/127 |
| 4,794,254 | 12/1988 | Genovese et al. | 250/324 |
| 4,879,569 | 11/1989 | Kubelik | 347/127 |
| 5,014,076 | 5/1991 | Caley, Jr. et al. | 347/127 |
| 5,027,136 | 6/1991 | Fotland et al. | 347/127 |
| 5,138,348 | 8/1992 | Hosaka et al. | 347/128 |
| 5,202,705 | 4/1993 | Asano et al. | 347/127 |
| 5,266,530 | 11/1993 | Bagley et al. | 438/20 |
| 5,561,348 | 10/1996 | Schoenbach et al. | 315/169.1 |
| 5,710,487 | 1/1998 | Valcke | 315/205 |

OTHER PUBLICATIONS

John R. Rumsey, David Bennewitz "Ion Printing Technology", Journal of Imaging Technology, vol. 12, No. 3, Jun. 1986.

*Primary Examiner*—N. Le
*Assistant Examiner*—L. Anderson
*Attorney, Agent, or Firm*—William J. Burke

[57] ABSTRACT

An inexpensive, robust plasma discharge emitter that repeatably creates a patterned charge on a substrate. To facilitate highly accurate charge deposition, each emitter contains a plasma well for confining the plasma within the emitter. Additionally, a plurality of emitters are arranged in an array to provide a practical charge patterning device. Furthermore, to fabricate an emitter or an array of emitters, a relatively low-cost, repeatable method of fabrication is used that relies upon conventional integrated circuit fabrication techniques.

25 Claims, 6 Drawing Sheets

PLASMA DISCHARGE EMITTER DEVICE AND ARRAY

This application claims benefit of U.S. provisional patent application Ser. No. 60/046,662, filed May 16, 1997.

The invention relates to plasma discharge devices and, more particularly, plasma discharge emitter devices that are arranged in an array for developing a charge pattern upon a substrate.

BACKGROUND OF THE DISCLOSURE

A key element of high speed, industrial print-on-demand systems is the availability of high speed, highly uniform, patterning devices. One form of patterning device is an electrostatic emitter for ionographic, non-impact printing. The emitter develops a charge pattern on a substrate, e.g., a dielectric drum or plate. The charge pattern is transferred to a print medium and the medium is then coated with a toner powder or liquid that adheres to the charge pattern. The print medium is heated to fix the toner to the medium.

Within the field of electrostatic emitters, the are a wide variety of techniques for charging a substrate in a specific pattern. One common technique for generating charged particles (e.g., ions or electrons) applies a very strong electric field across an air gap, where the air in the gap breaks down to produce ions and electrons. Such an electrostatic emitter is described in U.S. Pat. No. 4,675,703 issued on Jun. 23, 1987 to Richard A. Fotland. Specifically, Fotland discloses an emitter having a pair of electrodes separated by a dielectric. One of the electrodes, a control electrode, defines a hole within which the air (or other gas) will breakdown to produce charged particles. An AC voltage is applied across the electrode pair to form a strong electric field in the hole. In response to the electric field, the air breaks down and charged particles are formed in the hole. A third electrode, a screen electrode, is spaced by a dielectric from the control electrode. A hole in the screen electrode and its underlying dielectric is coaxial with the aperture in the control electrode. The screen electrode is biased with a DC voltage to select certain particle types, e.g., positively charged ions or negatively charged electrons, and accelerate the selected particles toward a substrate. To overcome the tendency of charged particles to diverge as they propagate toward the substrate, Fotland teaches using a deflection electrode to focus the charged particles. As a result, Fotland discloses a complex, multi-layer emitter that is relatively costly to fabricate.

Therefore, a need exists in the art for an inexpensive and simplified plasma discharge emitter device that selectively produces charged particles for patterning a substrate.

SUMMARY OF THE INVENTION

The disadvantages associated with the prior art are overcome by the present invention of an inexpensive, robust plasma discharge emitter that repeatably creates a patterned charge on a substrate. In one embodiment of the invention, a plurality of the inventive emitters are arranged in an array to provide a practical charge patterning device. Furthermore, the invention includes a method of fabricating the plasma discharge emitter and array.

More specifically, the plasma discharge emitter contains a cathode electrode and an anode electrode that are spaced apart by an insulator layer. In a first embodiment of the invention, the insulator layer has a circular indentation located above the cathode electrode. The indentation has sloping sidewalls and a bottom. The anode electrode is deposited on the sidewalls and is open at the bottom of the indentation. The indentation forms a plasma well. To excite a plasma (ionized air) in the plasma well, an AC voltage is applied between the anode and cathode. The ions (or electrons) in the plasma are extracted from the well and urged toward a grounded substrate by application of a DC bias voltage, an accelerating voltage, between the anode and cathode electrodes. As such, depending upon the polarity of the DC bias voltage, either electrons or ions can be selectively extracted from the plasma well. A substrate, positioned proximate the emitter, is generally maintained at ground potential such that, once the selected particles are extracted from the plasma well, the extracted particles of either polarity are attracted to the substrate surface.

In a second embodiment of the invention, the insulator layer that separates the anode and cathode is substantially planar. The anode electrode is deposited upon the surface of the insulator layer and contains an aperture that is located over the cathode electrode. A second insulator layer is deposited over the anode electrode and a second aperture is formed in the second insulator layer. The second aperture is coaxially aligned with the first aperture and extends through the second insulator layer to the anode electrode. The second aperture forms a plasma well. As with the first embodiment of the emitter, an AC voltage and a DC bias voltage are applied to the cathode and anode to produce a plasma in the plasma well and extract charged particles from the well for deposition onto a substrate surface.

The individual emitters of either the first or second embodiments can be arranged into an array to form either a linear array or an area array. As such, the array elements are individually driven to create a charge pattern on a substrate positioned proximate the array.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
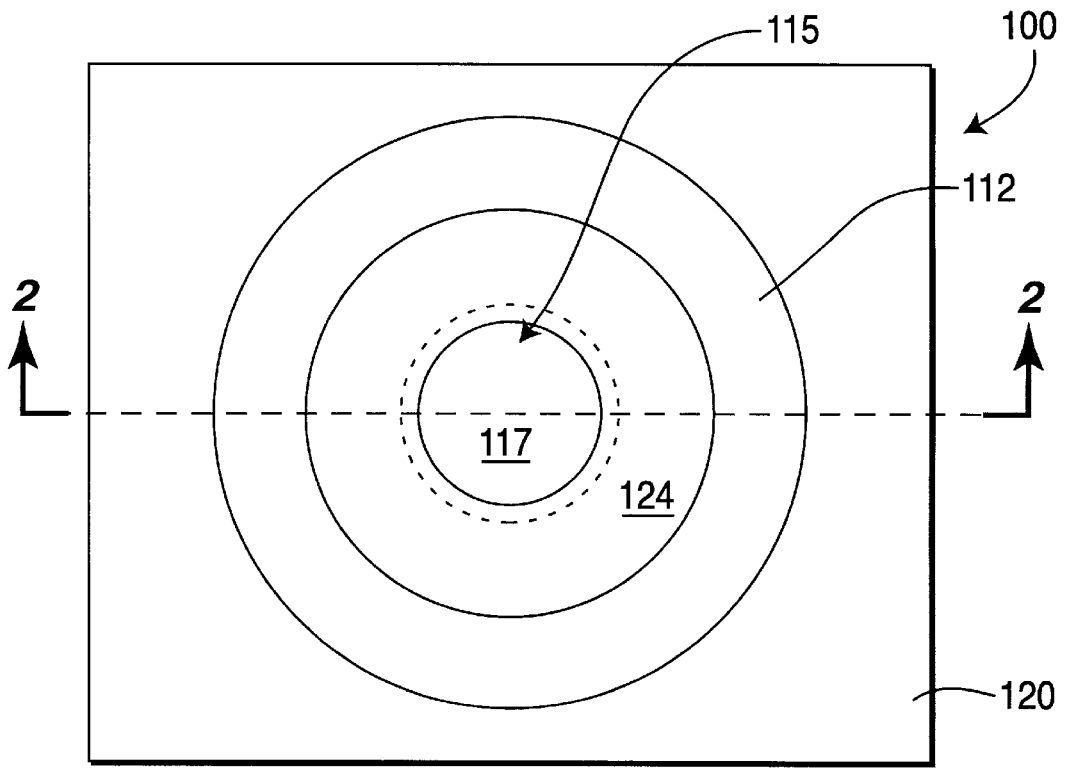
FIG. 1 depicts a top plan view of a plasma discharge emitter of a first embodiment of the present invention.
Figure 2:
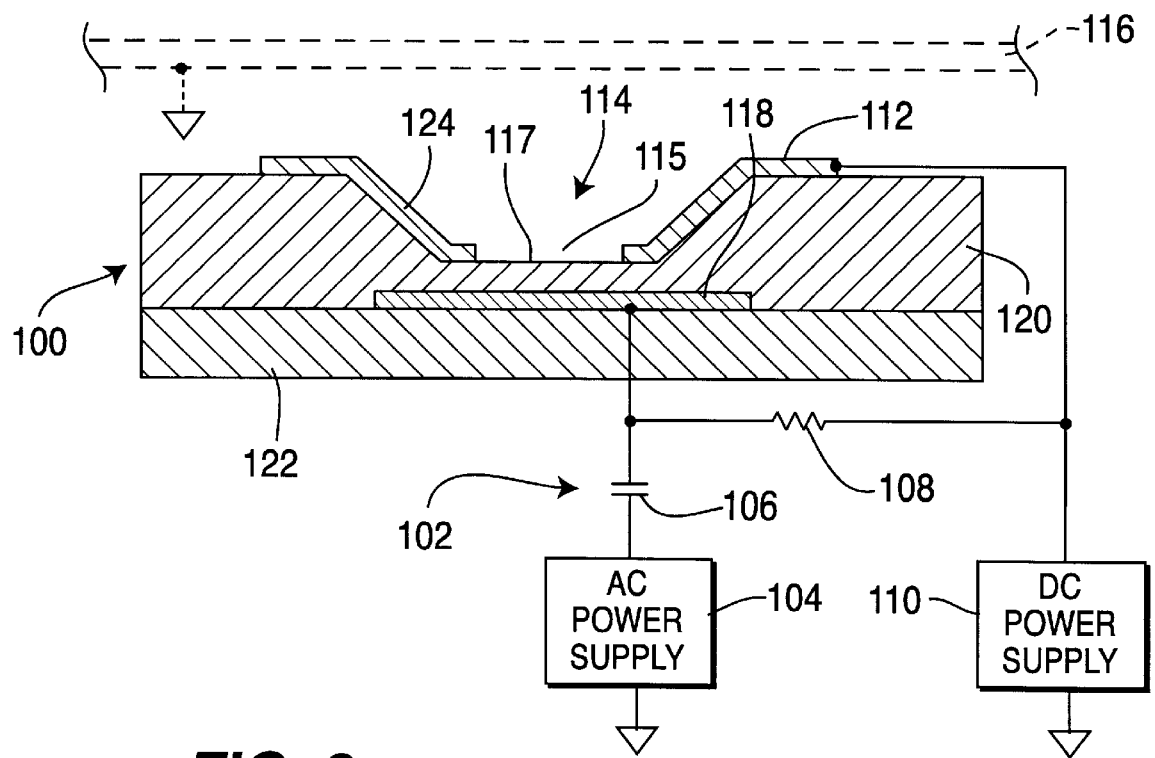
FIG. 2 depicts a cross sectional view of the plasma discharge emitter taken along line 2—2 of FIG. 1.

FIG. 1 depicts top plan view of a first embodiment of the present invention. FIG. 2 depicts a cross sectional view of FIG. 1 taken along line 2—2. To best understand the first embodiment of the invention, the reader should simultaneously refer to FIGS. 1 and 2.

The plasma discharge emitter 100 contains a base substrate 122, a cathode electrode 118, an insulator layer 120, and an anode electrode 112. The emitter 100 is coupled to power supply electronics 102 that powers the emitter 100. The base substrate 122 is, for example, a sapphire material. Although silicon and other insulating materials could also be used as a base substrate. The cathode electrode 118 is formed upon the base substrate using a conductive material such as a metal, highly-doped polycrystalline silicon, or other conductive material. The anode electrode 112 is spaced apart from the cathode electrode 118 by the insulator layer 120. The insulator layer is approximately 4 microns thick and is fabricated of a glass material such as borophosphosilicate glass (BPSG) or a similar material. A plasma well 114 is formed generally by etching an indentation into the surface of the insulator 120. The well 114 has sloping sides 124 that extend from the surface of the insulator layer 120 to the bottom of the well 114 at an angle of 30 degrees. The anode electrode 112 is formed of a conductive material such as tungsten having a thickness of 0.5 $\mu$m. The electrode 112 extends from the surface of the insulator layer 120 along the sides 124 of the well 114 and onto the bottom 117 of the well 114. An aperture 115 is formed in the electrode 112 at the bottom 117 of the well 114. The well 114 is approximately 2 um deep leaving a 2 micron thick layer between the bottom 117 and the cathode electrode 118. The well 114 has a diameter of approximately 50 um. The aperture 115 has an approximately 20 um diameter.

In a printing application, a chargeable substrate 116 such as the dielectric surface of a drum or plate is position proximate the emitter 100. The substrate is separated from the emitter by 10 to 30 mils and is maintained at a different potential than the emitter electrodes, e.g., the substrate is grounded. One type of substrate is a conductive drum having a dielectric coating, e.g., an oxide layer having a 5–10 micron thickness grown on the cylindrical surface of the drum. As such, particles extracted from the emitter charge a particular location on the substrate 116. The charge can then be transferred to a printable medium, e.g., paper, and a toner applied to the charge pattern. The patterned toner can then be fixed to produce a printed image.

The power supply electronics 102 contain an AC power supply 104, a DC power supply 110, a coupling capacitor 106 and a bias resistor 108. The AC power supply 104 produces, for example, 850 VAC at a frequency of 5 MHz, while the DC power supply produces a bias voltage of 425 volts. The AC power supply is coupled through the coupling capacitor 106 to the cathode electrode 118 and through both the capacitor 106 and the bias resistor 108 to the anode electrode 112. The DC power supply is coupled to the anode electrode 112 and through the resistor 108 to the cathode electrode 118. In this configuration, the DC power supply forms an electric field between the substrate 116 and the cathode electrode 118 having a maximum field strength of 60 to 75 volts/mil within the 10 to 30 mil space. The AC electric field produced by the 850 volt AC supply ionizes the air within the plasma well 114 and the DC power supply biases the anode electrode 112 relative to the cathode electrode 118 such that charged particles are extracted from the plasma in the well 114. The polarity of the extracted particles, e.g., either ions or electrons, are determined by the polarity of the DC voltage applied to the anode electrode 112. Either the AC or the DC supply can be activated and deactivated to modulate the emitter.

The sloped sidewalls 124 of the well 114 control the size of the plasma such that the extracted charge only charges a small region (a dot) of the substrate 116. Thus, the resolution of a printer is affected by the size of the plasma well 114. Furthermore, the sloped structure that produces the anode electrode 112, having only a small portion of the electrode 112 near to the cathode electrode 118, produces a sufficient electric field to breakdown the air and form a plasma, but not a sufficient electric field to breakdown the dielectric insulator layer 120 or substantially sputter the anode electrode 112.

Figure 8:
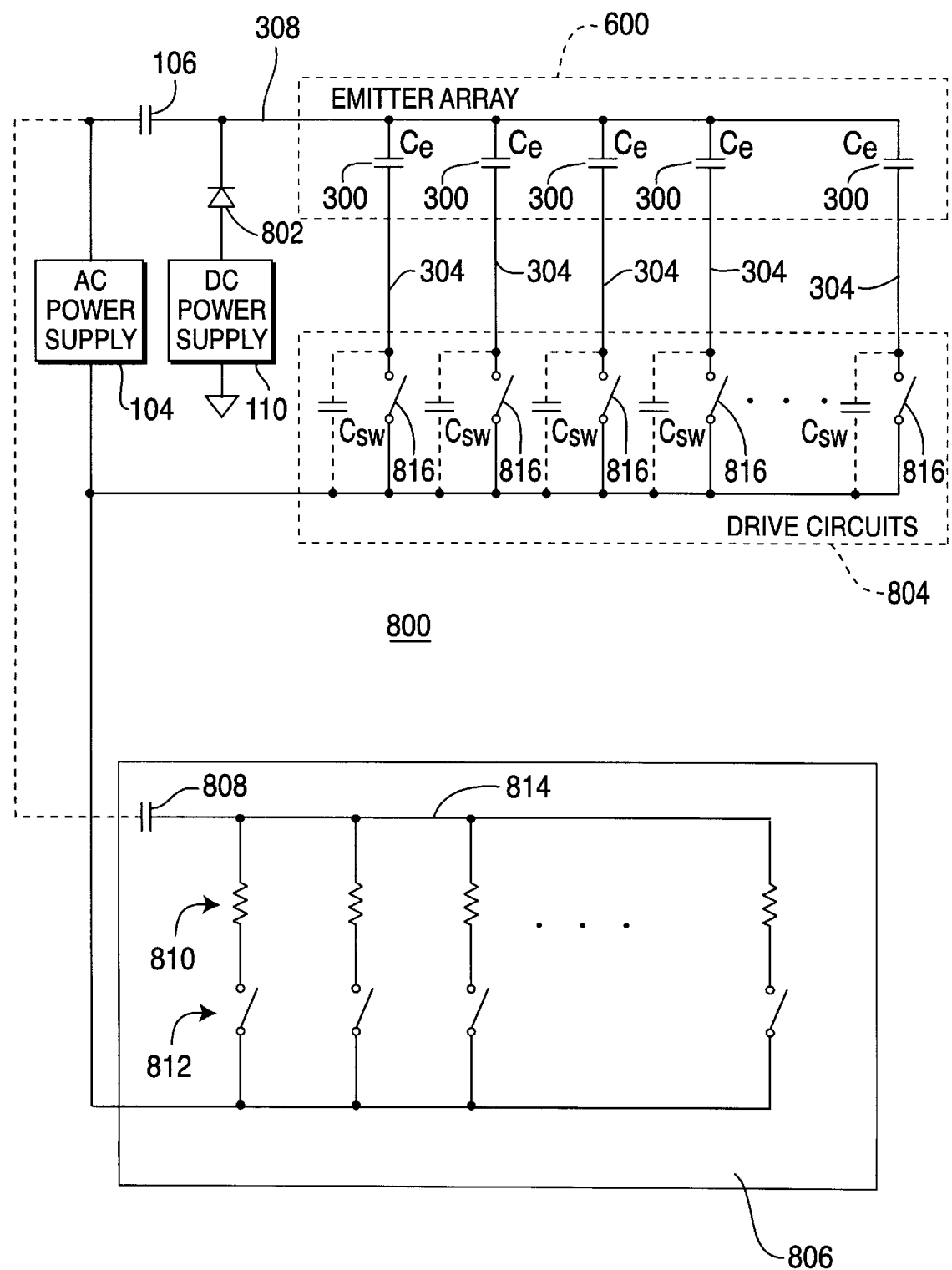
FIG. 8 depicts a schematic diagram of a control circuit for an array of plasma discharge emitters.
Figure 9:
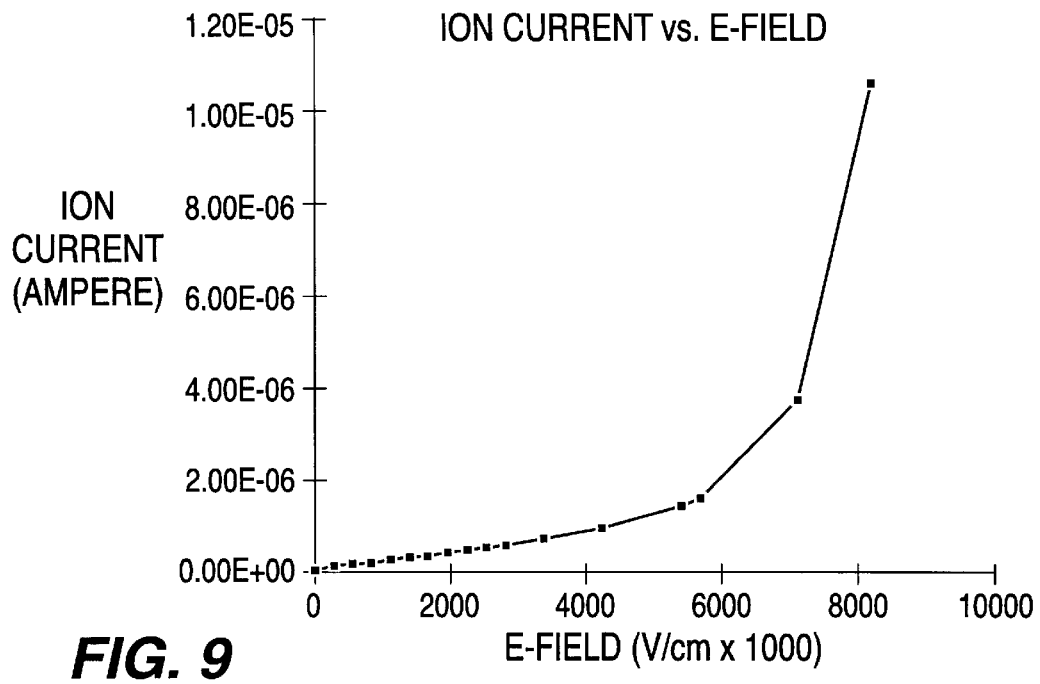
FIG. 9 depicts a graph of ion current versus electric field strength within the plasma well.

When both the AC and DC voltages are applied to the emitter, a portion of the free charge generated within the plasma is accelerated to the substrate surface while charges of opposite polarity are collected by the anode electrode. Additionally, some of the charged particles recombine within the plasma and with particles on the plasma well surface. The amount of charge that reaches the substrate surface has been shown to be a function of the power of the AC signal applied to the emitter and the electric field which exists between the substrate 116 and the emitter 100. FIG. 9 shows a graphical representation of ion current (amps) versus electric field strength (V/cm) for a representative emitter. As FIG. 8 shows, the ion current from the emitter to the substrate increases with the applied AC power (i.e., with increasing electric field) in a non-linear manner. Generally, for best results, the emitter is operated within the linear portion of the curve, e.g., 0 to 6,000 V/cm.

Figure 3:
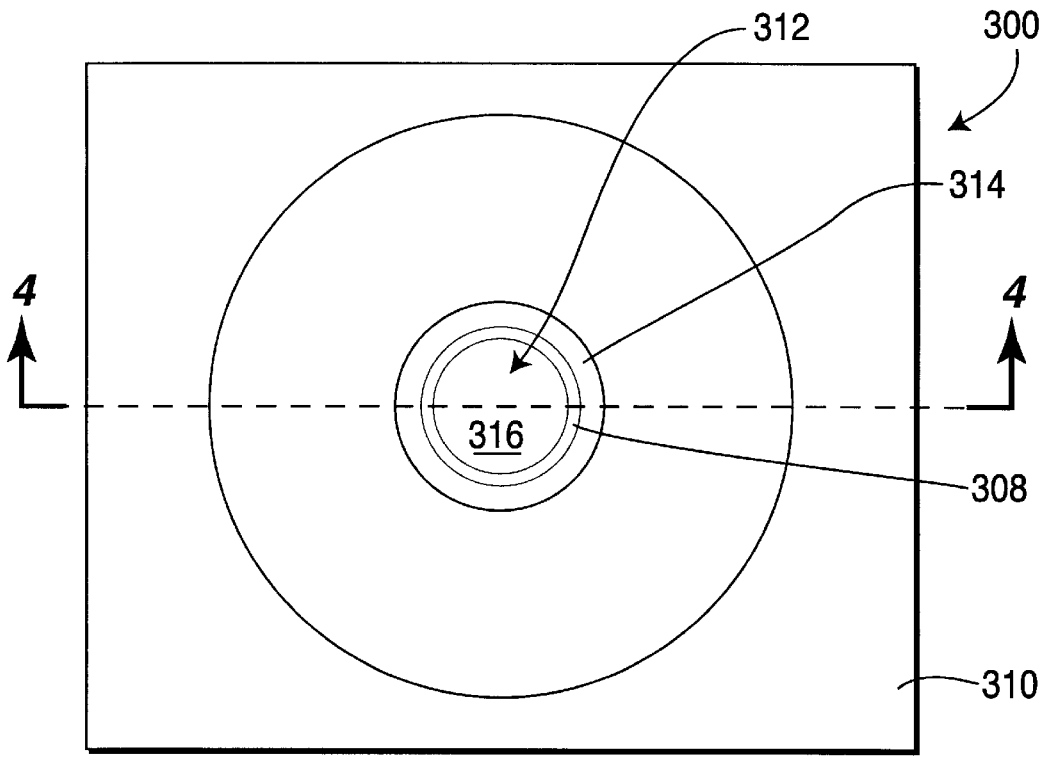
FIG. 3 depicts a top plan view of a plasma discharge emitter of a second embodiment of the present invention.
Figure 4:
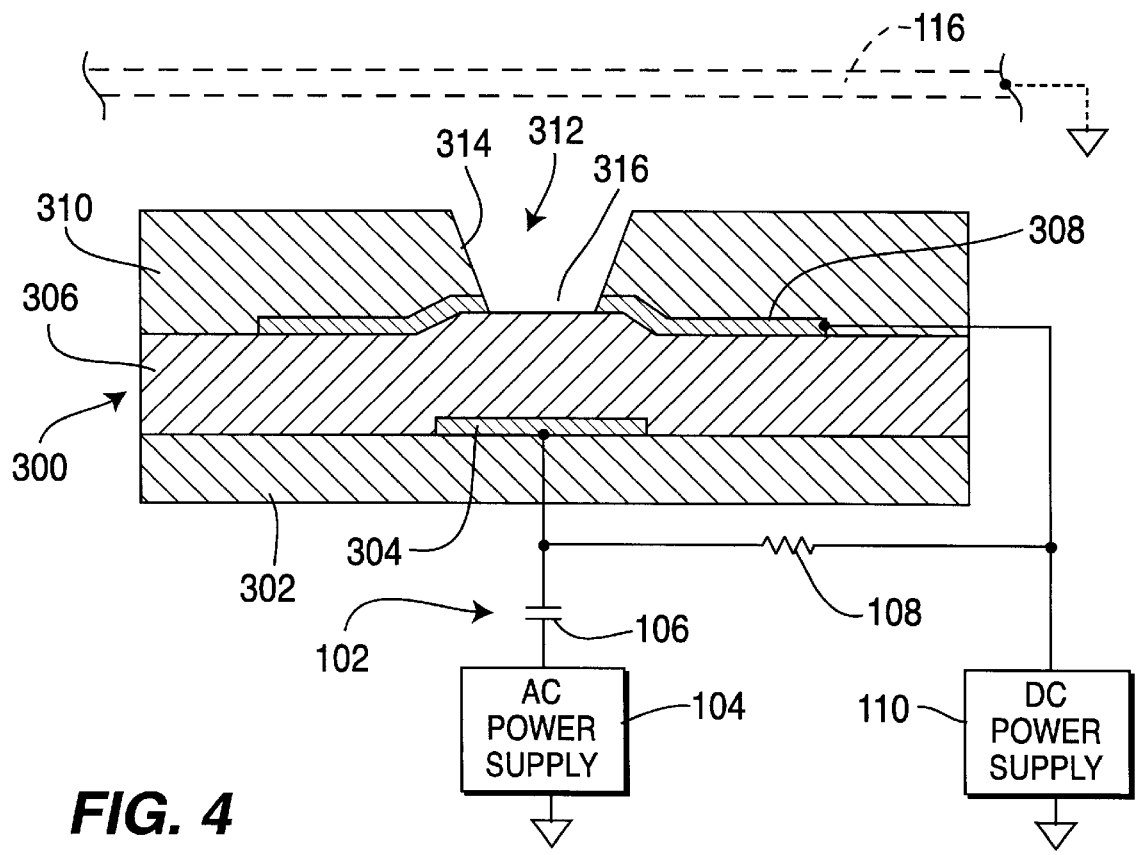
FIG. 4 depicts a cross sectional view of the plasma discharge emitter taken along line 4—4 of FIG. 3.

FIG. 3 depicts a top plan view of a second embodiment of the plasma discharge emitter 300. FIG. 4 depicts a cross sectional view of the emitter 300 taken along line 4—4 of FIG. 3. To best understand the second embodiment of the invention, the reader should simultaneously refer to FIGS. 3 and 4.

The plasma discharge emitter 300 contains a base substrate 302, a cathode electrode 304, an insulator layer 306, an anode electrode 308 and a second insulator layer 310. As with the first embodiment, the base substrate 302 supports the cathode electrode 304 and the insulator layer 306. The insulator layer 306 maintains the cathode and anode electrodes 304 and 308 in a spaced-apart relation. In contrast to the first embodiment, this second embodiment does not have a plasma well formed in the first insulator layer 306. As such, the first insulator layer 306 has a substantially flat surface. The anode electrode 308 is formed upon the first insulator surface 306 with an aperture 316 aligned with the cathode electrode 304. The second insulator layer 310 is formed atop the anode electrode 308 and contains an aperture 312 (plasma well) that is coaxially aligned with the anode aperture 316. The plasma well aperture 312 has sloped sidewalls 314 that extend from the surface of the insulator layer 310 to the anode electrode 308. The diameter of the bottom of the aperture is slightly larger than the diameter of the anode aperture 308. The anode aperture 316 has a diameter of approximately 40 um and the mid-span diameter of the well 312 is approximately 50 um.

The emitter 300 is powered in the same manner and with the same power supply electronics 102 as the first embodiment of the invention. Consequently, the AC voltage forms an electric field that breaks down the air to form a plasma within the plasma well 312. The DC bias voltage extracts a particular type of charged particle from the well for deposition onto the substrate 116. As the plasma is formed within the plasma well, charged particles accumulate on the sloped side walls 314 of the well 312. These particles tend to focus the extracted particles, i.e., restrict the electric field to the center of the plasma well, and limit dispersion of the particles as they exit the well 312. The ion current produced by this embodiment varies with applied electric field in the same manner as the first embodiment, i.e., FIG. 9 depicts the general relationship between ion current and electric field for this embodiment as well as the first embodiment.

Both of the embodiments of the inventive plasma discharge emitter are a simple layered structure that is easily and inexpensively fabricated using well-known integrated circuit manufacturing processes. As such, the emitters can be inexpensively manufactured in various configurations such as single units or in arrays.

FIGS. 5A–5G depict process steps used to fabricate the second embodiment of the plasma discharge emitter 300. These process steps are adaptable to produce the first embodiment of the invention as well. This adaptation of the process is discussed below.

Figure 5A:
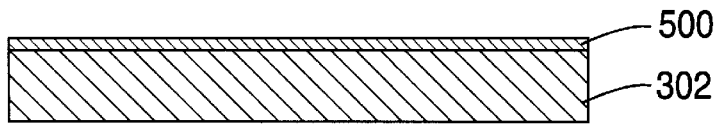
FIG. 5A–5G depict the process steps used to fabricate the plasma discharge emitter of the present invention.

As shown in FIG. 5A, the process begins with a base substrate 302. The substrate is an insulator, e.g., a glass material. Preferably, the base substrate is a material that permits the growth of crystalline silicon on its surface such as sapphire. A substrate of sapphire permits integrated circuit electronics to be created on the backside of the substrate without the use of wafer bonding. However, if sapphire is not used, conventional wafer bonding techniques can be used to attach the drive circuitry to the backside of the base substrate 302.

Figure 5B:
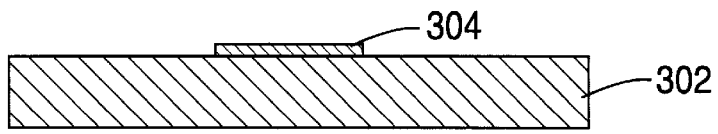

Upon the surface of the base substrate 302 is deposited or grown a conductive layer 500. Preferably, the conductive layer is a heavily doped layer 500 of N$^+$ polysilicon that is grown to a thickness of approximately 1 um. Alternatively, a metal such as tungsten could be deposited in lieu of the polysilicon to form the conductive layer 500. The conductive layer 500 is selectively etched to form a pattern for the cathode electrode 304 as depicted in FIG. 5B.

Figure 5C:
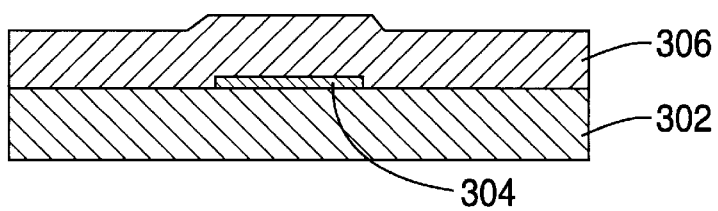

FIG. 5C depicts depositing a first insulator layer over the base substrate 302 and the cathode electrode 304. This insulator layer is preferably BPSG that is deposited using a chemical vapor deposition (CVD) process. However, the BPSG does not generally adhere very well to the sapphire and silicon. Therefore, a "primer" of silicon-dioxide ($SiO_2$) (not shown) having a thickness of approximately 300 angstroms is deposited over the base substrate and the anode electrode prior to CVD deposition of the BPSG. The BPSG is deposited to a thickness of 3 um. Thereafter, the BPSG is "reflowed" at 900 degrees Celsius for 35 minutes.

Figure 5D:
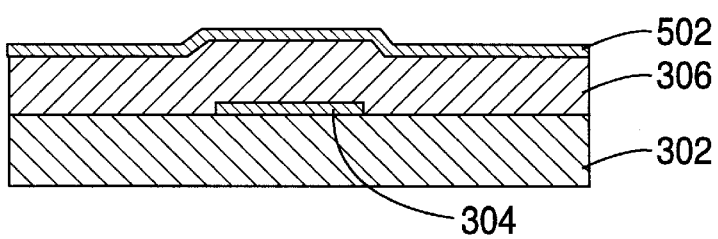
Figure 5E:
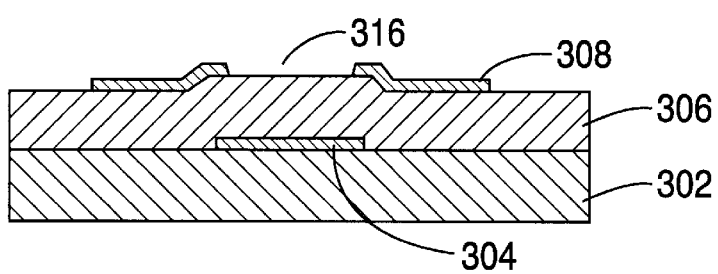

As shown in FIG. 5D, a layer 502 of conductive material is deposited over the BPSG surface. Preferably, the layer 502 is physical vapor deposition (PVD) deposited alloy of titanium and tungsten (TiW) to a depth of 0.5 um. Other conductive materials such as magnesium oxide or a thorium doped from of tungsten may be used to form the anode electrode. The layer 502 is patterned and etched to form the anode electrode 308 as shown in FIG. 5E.

Up to step 5D, the method for producing the first embodiment of the invention (FIGS. 1 and 2) are identical to those discussed above. However, prior to depositing the conductive layer atop the BPSG, the BPSG is etched to form the plasma well. Thereafter, the conductive layer is deposited and patterned to form the emitter of FIGS. 1 and 2.

Figure 5F:
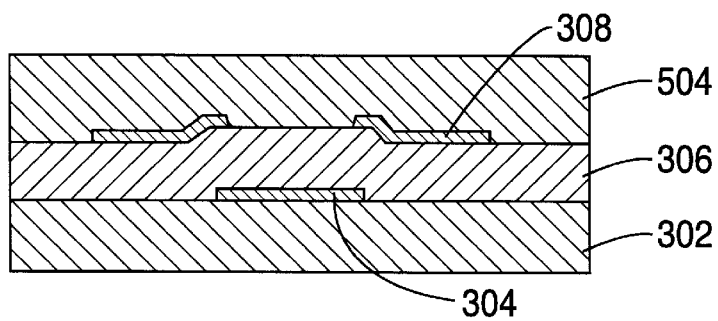
Figure 5G:
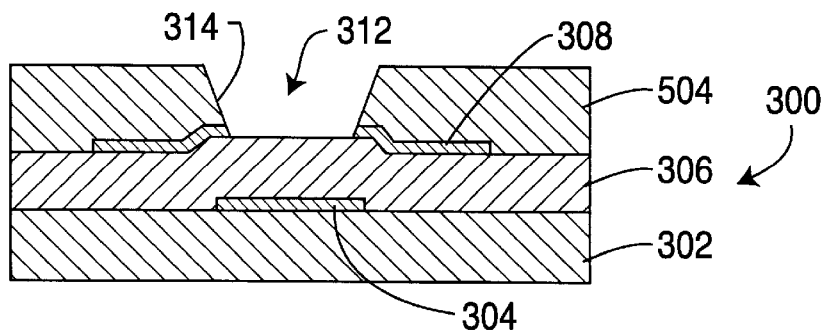

To continue with forming the second embodiment of the invention, FIG. 5F depicts the deposition of a second insulator layer 504, a layer of phosphosilicate glass (PSG). This layer 504 is CVD deposited to a thickness of approximately 3 um. Thereafter, the plasma well 312 is patterned and etched into the PSG layer 504. The PSG layer 504 is generally dry etched until almost through to the anode electrode 308, then a wet etch is used to complete formation of the plasma well 312. This completes the second embodiment 300 of the invention.

Although only a single emitter was shown being fabricated in FIGS. 5A–5G, it should be understood that the same process steps are accomplished to produce an array of emitters, i.e., a plurality of cathodes, anodes and plasma wells are fabricated at each of the foregoing process steps. Such arrays form practical implementations of the invention and shall be described next.

Figure 6:
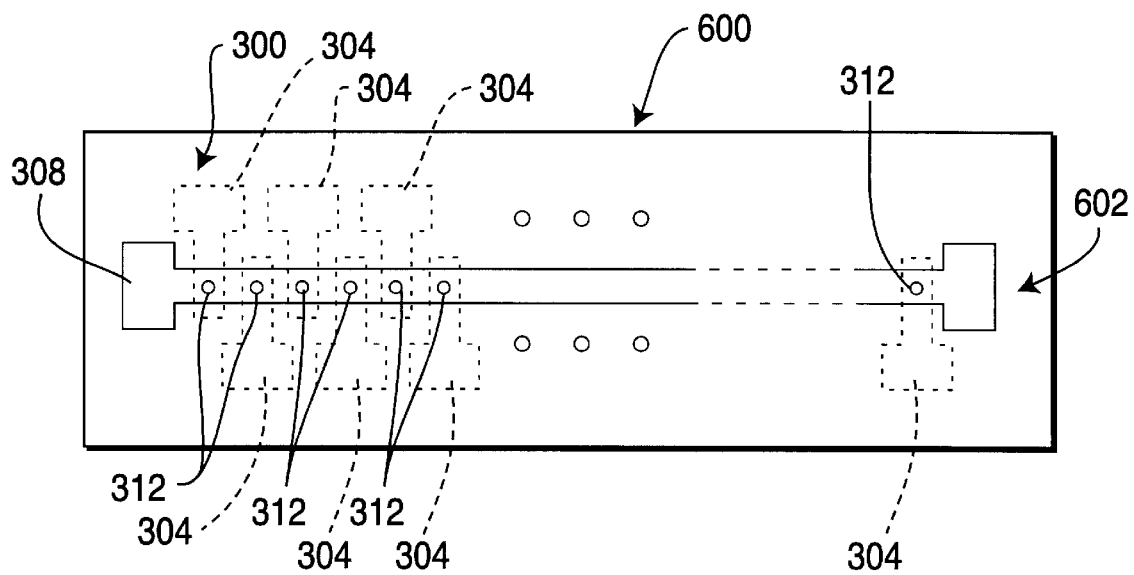
FIG. 6 depicts a top plan view of a linear array of plasma discharge emitters.

FIG. 6 depicts a top plan view of a linear array 600 of emitters (e.g., emitters 300 of the second embodiment). The array 600 is arranged such that the anode electrode 308 is a common electrode 602 for all the emitters 300 and the cathode electrodes 304 are each individually excited to produce the plasma in each emitter's respective plasma well 312. Such an array finds use as a print head in an ionographic printer. Each element of the array is selectively activated by applying AC power to the cathode electrodes to produce a charge pattern on a substrate. The electronics used to control the emitter array is discussed below with respect to FIG. 8.

Figure 7:
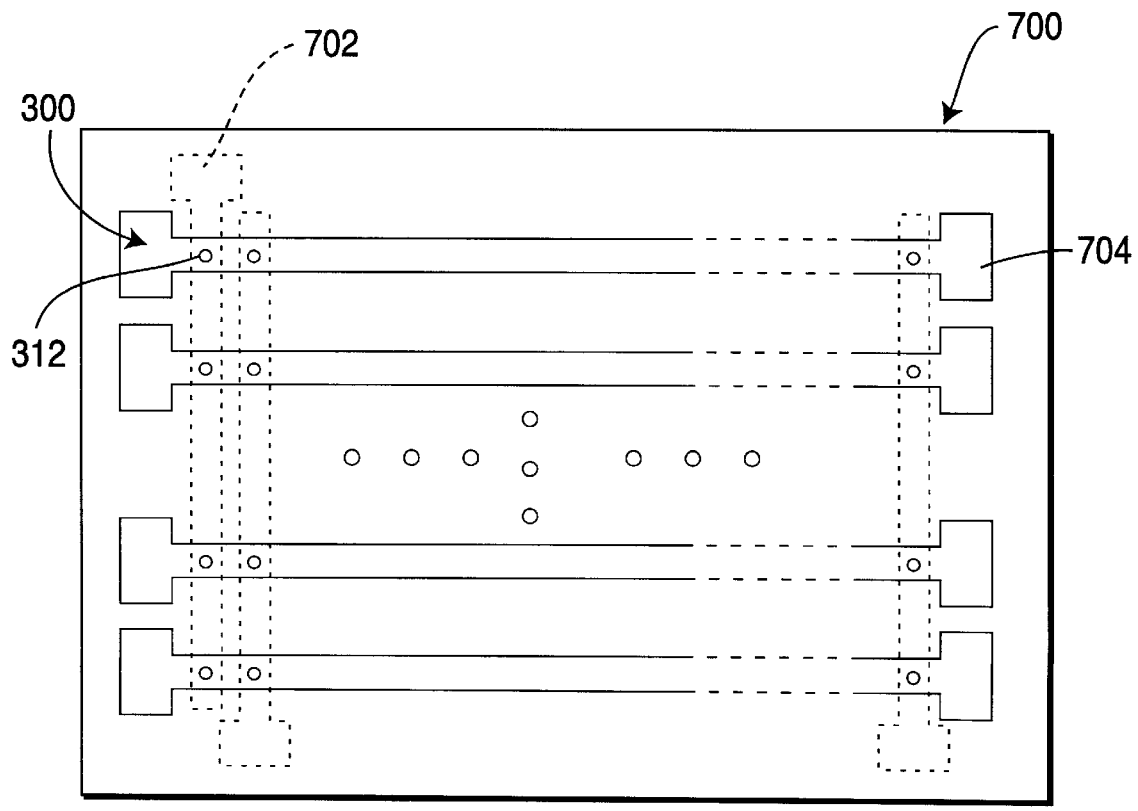
FIG. 7 depicts a top plan view of an area array of plasma discharge emitters.

FIG. 7 depicts a top plan view of an area array 700 of emitters (e.g., emitters 300 of the second embodiment arranged in a two-dimensional array of emitters). The area array 700 is, in essence, an assemblage of linear arrays. Specifically, the area array 700 contains a plurality of columnar cathode electrodes 702 (i.e., cathode electrodes that interconnect a plurality of emitters) and a plurality of row anode electrodes 704 (i.e., anode electrodes that form and interconnect the anodes of multiple emitters). To facilitate selective charge generation by each of the emitters 300, voltage is selectively connected through a solid state switch (not shown) to one or more selected row anode electrodes 704 and connected to one or more selected column cathode electrodes 702. By applying voltage to a particular row anode and a column cathode, a specific emitter located at the junction of the anode and cathode electrodes generates charged particles. Applying voltage to multiple columns and rows simultaneously generates charged particles from multiple emitters. As such, the area array can be used to produce a regional charge pattern that, for example, could be as large as a conventional 3 by 5 inch photograph. Thus, a substrate plate could be charged in a particular pattern (e.g., image) to facilitate printing an entire image at once.

A key feature of either embodiment of the emitter array is the ability to individually control the electrical discharge at each of the emitter sites within the array. By fabricating the emitters on an insulating substrate, the mutual capacitance as measured between the adjacent emitter sites is minimized. The reduced cross-site capacitance prevents neighboring emitters from unintentionally discharging due to an adjacent emitter discharge. Because of this emitter isolation, a number of system benefits are gained. In particular, the modulation index (i.e., ratio of ion current while emitting to ion current when the emitter is off) is essentially infinite due to the fact that there is no leakage current while an emitter is not generating a plasma discharge. Secondly, the average lifetime of a printhead array can be expected to be much longer than that as measured for an individual emitter because the emitter is only activated when needed and such activation can be assumed to be less than 100% duty cycle.

FIG. 8 depicts a schematic diagram of a system for selectively activating an array of emitters, e.g., a linear array such as that discussed with respect to FIG. 6. FIG. 8 depicts the emitters in an equivalent circuit form as capacitors $C_e$, i.e., the anode electrode 304 and cathode electrode 308 of each emitter forms a parallel plate capacitor having the insulator material (e.g. BPSG) as a dielectric. The system 800 contains a AC voltage source 104, a DC voltage source 110, a coupling capacitor 106, a clamping diode 802, an array 600 of emitters 300, and drive circuitry 804. Optionally, the system 800 contains a ballast circuit 806.

More specifically, the AC source 104 (e.g., a 5 MHz, 850 volt supply) has one terminal coupled to the blocking capacitor 106 and a second terminal connected to the drive circuitry 804. As such, the AC power is coupled through the capacitor 106 to the anode electrode 304 and the AC voltage is capacitively divides amongst the emitters 300. The DC source 110 (e.g., a 425 volt supply) has one terminal connected through the clamping diode 802 to the anode electrode 308 and a second terminal connected to ground. The DC bias voltage is continuously applied between the anode electrode and ground (i.e., the surface to be charged).

The AC voltage is clamped to the DC bias voltage (i.e., the AC voltage oscillates ±425 Volts about a DC level of 425 volts). The polarity of the DC voltage that is applied to the anode electrode depends upon the type of particle that is to be extracted from the plasma well, i.e., a negative DC voltage is used to extract ions and a positive DC voltage is used to extract electrons. The drive circuitry selectively couples the cathode electrode 304 of each emitter 300 to the AC power supply 104. In this manner, the circuitry modulates the electric field within each individual emitter, i.e., selectively exciting a plasma in a plasma well. The modulation is achieved by switching the high voltage (i.e., 500V) transistor (represented as switch 816) connected to the cathode electrode 304 of each of the emitters 300. This switching, in turn, will increase and decrease the amount of charge available to be accelerated towards the surface upon which the charge pattern is to adhere. As such, the resulting charge pattern is a function of the ratio of the electric field operating points. This technique, however, does not have the infinite modulation index of direct RF modulation (i.e., switching both the AC and DC voltage to each emitter on and off) but is capable of modulation indexes as high as 1000:1. A high modulation index is important because the resulting print quality is a function of the achievable signal-to-noise ratio available at each charge dot. This modulation technique adds a small DC bias to the substrate surface due to the leakage currents from each emitter. This DC bias on the substrate surface is considered noise.

More specifically, the drive circuitry contains a plurality of "switches" (e.g., high-voltage DMOS transistors 816), where each switch is connected to an independent cathode electrode 304 such that any single emitter 300 can be activated independently of all other emitters. When the switch 816 is "off", the switch forms a capacitor ($C_{sw}$) coupled in series with the emitter capacitance ($C_e$). The emitter capacitance and the switch capacitance are approximately equal in magnitude, e.g., approximately 0.1 pF. Consequently, the AC voltage evenly divides across each of the capacitors such that approximately 425 volts is applied across the emitter 300. This is not a sufficient voltage to produce a plasma. However, when the switch is "on", the switch capacitance ($C_{sw}$) is shunted by the conduction resistance of the switching transistor 816 such that nearly all of the AC voltage is applied to the emitter 300 and a plasma is formed in the plasma well.

The size of a "charge dot" that is accumulated on the substrate surface over time is directly proportional to the amount of time (i.e., the number of AC cycles) that the emitter is on. As such, gray scale control of the charge dot size is achieved by modulating the on-time of the emitter to between 16 and 128 cycles of the 5 MHz AC voltage. The relationship between the number of cycles and the amount of charge generated is relatively linear such that 120 cycles produces six times as much charge as 20 cycles of applied voltage. Therefore, if 60 feet per minute of printing is required at 600 dpi, the printhead must produce 7200 charge dots per second using 30 levels of gray scale. Of course, if another frequency is used the number of cycles necessary to achieve the same sized dot will vary.

One type of switching transistor 816 that is capable of switching high-voltage relatively quickly is a lateral DMOS transistor. The DMOS transistor can switch a maximum of 1000 to 1200 volts in less than 100 nS and have an "on" resistance of approximately 50 to 200 ohms. Of course, other high-voltage switching transistors may be substituted for the DMOS transistor.

Using a capacitively distributed AC source, as described above, does cause the AC voltage distribution to vary depending upon the number of emitters that are active at any one time. To facilitate uniform charge generation no matter the number of emitters that are active, an optional ballast circuit 806 is added to the system 800. The ballast circuit contains a coupling capacitor 808, a plurality of resistors 810 and a plurality of switches 812. The capacitor 808 couples the AC source 104 to a common electrode 814. The common electrode interconnects a first terminal of each of the resistors 810. The second terminal of each of the resistors is connected through a switch 812 to a second terminal of the AC source 104. The resistors provide a variable ballast load for the AC source. In particular, the smallest value resistor (e.g., $R_L$) is equivalent to the load that a single emitter in series with an active transistor provides for the AC source. To form a binary weighted ballast, the other resistors in the ballast load have a resistance of $2R_L$, $4R_L$, $8R_L$ and so on up to $2^n/_2 R_L$ (i.e., until the sum of all the ballast load values equals $2^n R_L$), where n is the number of emitters 300 in the array 600. As such, a binary selection technique can be used to select appropriate inverse loading to compensate for the number of emitters that are active during any given print period.

A key feature of this print head array design is the expected uniformity that can be produced across each of the emitter sites. This is primarily due to the method used to construct the array. It is known that the volume of a surface plasma and the potential to extract free charge of either polarity from that volume is a function of the electrode geometries, the level a RF power applied between the electrodes, and the chemical composition of the gas used to create the plasma. Assuming that the RF power and the atmosphere are constant for each of the emitters, it can therefore be concluded that the single, most significant contributor to array nonuniformity is due to the differences between emitter electrode geometries. This, in fact, was the primary reason that IC circuit fabrication techniques were chosen as a means for producing the single emitter and the emitter array of the present invention. Experimental arrays of emitters have used emitter discharge diameters (the mid-point diameter of the plasma well) of 5 um, 10 um, 20 um, and 40 um. The diameter variations from emitter-to-emitter have an estimated maximum of 0.11 um; therefore, yielding emitter arrays with uniformity better than one percent for emitters having discharge diameters greater than 10 um i.e., the switching transistor 816 is preferably fabricated on the backside of the base substrate of the array.

Figure 10:
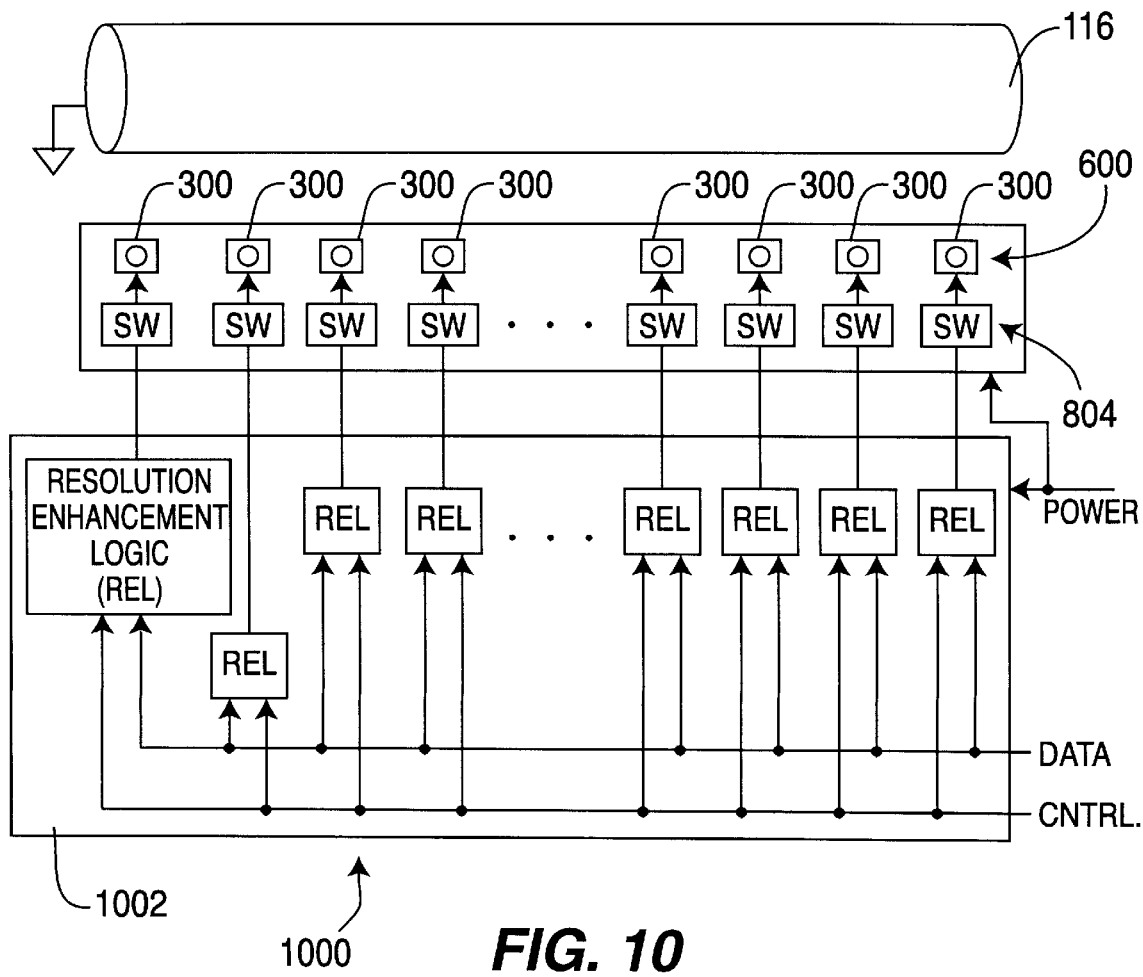
FIG. 10 depicts a block diagram of an illustrative printing system incorporating a plurality of inventive plasma discharge emitters.

FIG. 10 depicts a block diagram 1000 of a complete print head system using linear emitter array 600. The array 600 is electrically connected to a low cost printed circuit board which supplies the digital modulation data, DC and AC power to the emitter array 600. Common to the emitter array 600 is the electronics needed for individual emitter modulation. To each emitter 300, there is coupled digital logic 1002 to perform the resolution enhancement function. The resolution enhancement logic 1002 consists of an n-bit digital shift register, an n-bit, parallel load, digital counter, and counter decode logic used to form a pulse width modulated signal.

Although various embodiments which incorporate the teachings of the present invention have been shown and described in detail herein, those skilled in the art can readily devise many other varied embodiments that still incorporate these teachings.

What is claimed is:

1. Apparatus for generating charged particles comprising:
   a substrate; and
   a plasma discharge emitter, located upon said substrate, containing a plasma well having sloping sides within which a plasma is selectively formed and contained.

2. The apparatus of claim 1 wherein said emitter comprises:
   a first electrode positioned atop the substrate;
   an insulator layer covering said first electrode and having a top surface containing an indentation located above the first electrode, where the indentation has a bottom and sides that slope from the top surface to the bottom to form a plasma well; and
   a second electrode, located on the top surface of said insulator layer and extending along said sides to said bottom of said indentation, where said second electrode defines an aperture atop said bottom of said indentation that is over the first electrode.

3. The apparatus of claim 2 further comprising:
   an AC voltage supply coupled to said first electrode; and
   a DC voltage supply coupled to said first electrode and said second electrode.

4. The apparatus of claim 3 further comprising:
   a switch, connected between said AC voltage source and a chargeable substrate, for selectively generating an electric field between said chargeable substrate and said first electrode that produces a plasma within said plasma well.

5. The apparatus of claim 4 wherein said switch applies a selected number of cycles of AC voltage to said first electrode, where the number of cycles of AC voltage is proportional to the amount of charge accumulated on said chargeable surface.

6. The apparatus of claim 4 wherein said substrate has a first surface and an opposing second surface, where said emitter is formed upon said first surface of said substrate and said switch is formed on said second surface of said substrate.

7. The apparatus of claim 1 wherein said emitter comprises:
   a first electrode positioned atop the substrate;
   a first insulator layer deposited atop said first electrode;
   a second electrode, located upon said first insulator layer and defining an aperture that is located above said first electrode, where said first insulator layer maintains the first electrode and second electrode in a parallel spaced-apart relation; and
   a second insulator layer having a top surface containing an aperture located above the first electrode, where the aperture is coaxially aligned with the second electrode aperture and extends from the top surface of the second insulator to the second electrode to form a plasma well.

8. The apparatus of claim 7 further comprising:
   an AC voltage supply coupled to said first electrode; and
   a DC voltage supply coupled to said first electrode and said second electrode.

9. The apparatus of claim 8 further comprising:
   a switch, connected between said AC voltage source and a substrate, for selectively generating an electric field between said substrate and said first electrode that produces a plasma within said plasma well.

10. The apparatus of claim 9 wherein said switch applies a selected number of cycles of AC voltage to said first electrode, where the number of cycles of AC voltage is proportional to the amount of charge accumulated on said chargeable surface.

11. The apparatus of claim 9 wherein said substrate has a first surface and an opposing second surface, where said emitter is formed upon said first surface of said substrate and said switch is formed on said second surface of said substrate.

12. The apparatus of claim 8 further comprising a switch, connected to said emitter, for selectively applying said AC voltage between said first and second electrodes to form a plasma in said plasma well.

13. The apparatus of claim 12 wherein said switch applies a selected number of cycles of AC voltage to said first electrode, where the number of cycles of AC voltage is proportional to the amount of charge accumulated on said chargeable surface.

14. The apparatus of claim 13 wherein said substrate has a first surface and an opposing second surface, where said emitter is formed upon said first surface of said substrate and said switch is formed on said second surface of said substrate.

15. Apparatus for producing a plurality of charging locations comprising:
    a substrate; and
    a plurality of plasma discharge emitters, located upon said substrate, where each plasma discharge emitter in said plurality of plasma discharge emitters contains a plasma well having sloped sides within which a plasma is selectively formed and contained.

16. The apparatus of claim 15 further comprising a ballast circuit connected to said plurality of plasma discharge emitters.

17. The apparatus of claim 15 wherein said substrate is an insulator.

18. The apparatus of claim 15 wherein said plurality of plasma discharge emitters comprises:
    a plurality of first electrodes deposited atop said substrate;
    an insulator layer deposited over said plurality of first electrodes, said insulator layer having a top surface containing a plurality of indentations located above the first electrode, where each of the indentations is aligned with one of said first electrodes and has a bottom and sides that slope from the top surface to the bottom to form a plasma well; and
    a second electrode, located on the top surface of said insulator layer and extending along said sides to said bottom of each of the indentations in said plurality of indentations, where said second electrode defines an aperture atop said bottom of each of said indentations that is over the first electrode.

19. The apparatus of claim 18 further comprising:
    an AC voltage supply coupled to said second electrode;
    a DC voltage supply coupled to said second electrode and a chargeable substrate; and a plurality of switches, each of said switches in said plurality of switches connected between one of said first electrodes and said AC voltage supply for selectively generating a plasma within said plasma well.

20. The apparatus of claim 19 wherein each switch in said plurality of switches applies a selected number of cycles of AC voltage to said first electrode, where the number of cycles of AC voltage is proportional to the amount of charge accumulated on said chargeable surface.

21. The apparatus of claim 19 wherein said substrate has a first surface and an opposing second surface, where said first electrode, said second electrode and said insulator layer are formed upon said first surface of said substrate and said plurality of switches is formed on said second surface of said substrate.

22. The apparatus of claim 15 wherein said plurality of plasma discharge emitters comprises:

a plurality of first electrodes positioned atop the substrate;

a first insulator layer deposited atop said first electrodes;

an second electrode, located upon said first insulator layer and defining a plurality of apertures that are each located above each of said first electrodes, where said first insulator layer maintains the first electrodes and second electrode in a parallel spaced-apart relation; and a second insulator layer having a top surface containing a plurality of apertures located above each of said first electrodes, where each of the apertures is coaxially aligned with each of the second electrode apertures and extends from the top surface of the second insulator to the second electrode to form each of the plasma wells.

23. The apparatus of claim 22 further comprising:

an AC voltage supply coupled to said second electrode;

a DC voltage supply coupled to said second electrode and a chargeable substrate; and a plurality of switches, each of said switches in said plurality of switches connected between one of said first electrodes and said AC voltage supply for selectively generating a plasma within said plasma well.

24. The apparatus of claim 23 wherein each switch in said plurality of switches applies a selected number of cycles of AC voltage to said first electrode, where the number of cycles of AC voltage is proportional to the amount of charge accumulated on said chargeable surface.

25. The apparatus of claim 23 wherein said substrate has a first surface and an opposing second surface, where said first electrode, said second electrode and said insulator layer are formed upon said first surface of said substrate and said plurality of switches is formed on said second surface of said substrate.

* * * * *